US012650535B2

(12) United States Patent de Oliveira et al.

(10) Patent No.: US 12,650,535 B2

(45) Date of Patent: Jun. 9, 2026

(54) METHOD FOR GENERATING SYNTHETIC T1-T2 MAPS FROM MARGINAL DISTRIBUTIONS OF NUCLEAR MAGNETIC RESONANCE LOGGING TOOLS

(71) Applicant: PETRÓLEO BRASILEIRO S.A.—PETROBRAS, Rio de Janeiro (BR)

(72) Inventors: Lucas Abreu Blanes de Oliveira, Rio de Janeiro (BR); Moacyr Silva Do Nascimento Neto, Rio de Janeiro (BR)

(73) Assignee: PETRÓLEO BRASILEIRO S.A.—PETROBRAS, Rio de Janeiro (BR)

( * ) Notice: Subject to any disclaimer, the term of this patent is extended or adjusted under 35 U.S.C. 154(b) by 170 days.

(21) Appl. No.: 18/644,857

(22) Filed: Apr. 24, 2024

(65) Prior Publication Data

US 2024/0361485 A1 Oct. 31, 2024

(30) Foreign Application Priority Data

Apr. 25, 2023 (BR) ........................ 10 2023 0078095

(51) Int. Cl.

| | |
|---|---|
| *G01V 3/32* | (2006.01) |
| *G01N 24/08* | (2006.01) |
| *G01R 33/38* | (2006.01) |
| *G01R 33/44* | (2006.01) |
| *G01R 33/50* | (2006.01) |
| *G01R 33/56* | (2006.01) |
| *G01V 3/38* | (2006.01) |

(52) U.S. Cl.

CPC ............. *G01V 3/38* (2013.01); *G01N 24/081* (2013.01); *G01R 33/448* (2013.01); *G01R 33/50* (2013.01); *G01R 33/5608* (2013.01); *G01V 3/32* (2013.01); *G01R 33/3808* (2013.01)

(58) Field of Classification Search

CPC .......... G01V 3/38; G01V 3/32; G01N 24/081; G01R 33/5608; G01R 33/3808; G01R 33/448; G01R 33/50

See application file for complete search history.

(56) References Cited

U.S. PATENT DOCUMENTS

| | | |
|---|---|---|
| 2005/0240349 A1 | 10/2005 | Goswami et al. |
| 2008/0221800 A1* | 9/2008 | Gladkikh ................. G01V 3/32 |
| | | 702/11 |

(Continued)

*Primary Examiner* — Rishi R Patel

(74) *Attorney, Agent, or Firm* — McCarter & English, LLP; Wei Song

(57) ABSTRACT

The present invention falls within the area of well logging to evaluate formations in oil and gas producing fields. Particularly, the present invention describes a method for generating synthetic T1-T2 maps from marginal distributions of nuclear magnetic resonance logging tools, wherein the method comprises: decomposing marginal distributions of T1 and T2 relaxation times into an initial sum of log-normal functions with the same amplitudes and different means and standard deviations; setting the initial amplitudes, means and standard deviations so that the sum of log-normal functions corresponds to the marginal distributions of T1 and T2; and using the amplitudes, means and standard deviations set in a sum of two-dimensional log-normal functions to generate a synthetic T1-T2 map.

19 Claims, 11 Drawing Sheets

(10 of 11 Drawing Sheet(s) Filed in Color)

(56) References Cited

U.S. PATENT DOCUMENTS

| | | |
|---|---|---|
| 2017/0123098 A1 | 5/2017 | Wang et al. |
| 2017/0343497 A1 | 11/2017 | Anand et al. |
| 2020/0264331 A1 | 8/2020 | Venkataramanan et al. |

* cited by examiner

METHOD FOR GENERATING SYNTHETIC T1-T2 MAPS FROM MARGINAL DISTRIBUTIONS OF NUCLEAR MAGNETIC RESONANCE LOGGING TOOLS

RELATED APPLICATIONS

This application claims the benefit of Brazilian Patent Application No. 10 2023 0078095, filed Apr. 25, 2023, the entire contents of which are explicitly incorporated by reference herein.

FIELD

The present invention is applied in the area of well logging to evaluate formations in oil and gas producing fields. More specifically, the present invention relates to a method for generating synthetic relaxation time maps (T1-T2) from marginal distributions T1 and T2 obtained in geological formations using nuclear magnetic resonance (NMR) logging tools.

BACKGROUND

This section aims to present a theoretical foundation related to various aspects of the present techniques described and/or claimed throughout the subsequent sections. This discussion will be useful in providing background information to facilitate the understanding of the several aspects of the present invention. Consequently, it must be understood that this section must be read in that light, and not as an admission of any kind.

The identification and quantification of fluids from a well drilled in a geological formation is a complex activity, especially when dealing with hydrocarbons in an oil well. Commonly, decisions involved in the exploration and production of hydrocarbons are supported by measurements from logging tools run along the wellbore. These measurements can be used to infer properties and characteristics of the geological formation, such as porosity, hydrocarbon saturation, and permeability.

There are some well logging tools available, such as nuclear magnetic resonance (NMR) tools. In general terms, an NMR tool measures the response of the spins of atomic nuclei present in fluids when subjected to magnetic fields.

The atomic nucleus of the fluid exhibits a precession movement around the axis defined by the applied magnetic field, generating a measurable effect. NMR tools are tuned to the resonance frequency of the hydrogen nucleus, an abundant element in the fluids of geological formations. During measurements, a constant magnetic field ($B_0$) causes the protons in the hydrogen nuclei to precess, aligning themselves parallel to the direction of that field. Thus, a transmitting antenna generates a second magnetic field ($B_1$) oscillating by radio frequency, perpendicular to the constant magnetic field $B_0$, reorienting the nuclei at 90° in relation to $B_0$, obtaining maximum signal. As soon as the oscillating magnetic field $B_1$ is turned off, the nuclei begin to return to the orientation defined by the constant magnetic field $B_0$ and the intensity of the acquired signal decays exponentially.

The characteristic times of the process of hydrogen nuclei returning to their original orientation, after turning off the field $B_1$, are known as formation relaxation times, called T1 (longitudinal magnetization recovery time) and T2 (transversal magnetization decay time).

These relaxation times are functions of three relaxation mechanisms that occur simultaneously in fluids: i) bulk relaxation, related to intrinsic characteristics of the fluids; ii) surface relaxation, resulting from the interaction between the fluids and the surface of the pores that contain them; and iii) relaxation by molecular diffusion, which is related to the decay of spin magnetization due to non-uniform external field gradients. These relaxation mechanisms are defined by the following equations:

$$\frac{1}{T_1} = \frac{1}{T_{1B}} + \rho_1 \frac{S}{V} \tag{1}$$

$$\frac{1}{T_2} = \frac{1}{T_{2B}} + \rho_2 \frac{S}{V} + \frac{D(\gamma G T_E)^2}{12} \tag{2}$$

wherein:
$T_{1B}$ and $T_{2B}$ are the bulk relaxation times of the fluid;
S and V are, respectively, the pore surface and volume;
$\rho$ is the surface T1 or T2 relaxivity;
D is the molecular diffusivity of the fluid;
$\gamma$ is the gyromagnetic ratio of the proton;
G is the gradient of $B_0$; and
$T_E$ is the time between echoes.

Thus, measurements obtained by NMR logging tools can include distributions of relaxation time T1, relaxation time T2, molecular diffusivity D, or a combination of the three. For example, an NMR tool may measure only the distributions of T1 or T2, as exemplarily shown in FIG. 1, the joint distributions of T1 and T2 on a map, as exemplarily shown in FIG. 2, or D and T2 on a map, or even the joint distribution of T1, T2 and D.

Given the differences in the relaxation mechanisms that affect T1 and T2, as previously described, it is possible to carry out the typification and quantification of different fluids present in the formation and make inferences regarding their mobilities through analysis of T1-T2 maps, as shown in the map illustrated in FIG. 2. In this map, it is observed that water and some hydrocarbons have a signal close to the T1T2 ratio equal to one. This is due to the fact that these fluids have low molecular diffusivity, bringing this term closer to zero in Equation 2 and bringing the values of T1 and T2 closer together. Hydrocarbons with gas in their composition will have more significant diffusivity values, reducing T2 values and increasing the T1T2 ratio, positioning them higher on the map and allowing clear identification. Fluids of this nature cannot be identified and quantified only in the marginal distributions of since T1 or T2, their characteristic signals overlap.

Regarding nuclear magnetic resonance profiles, whether 1D distributions, 2D maps, or the 3D joint acquisition of T1, T2 and D, it should be noted that they are acquired through specific NMR tool activation schemes, called sequences of pulses, which describe specific periods of transmission and reception of electromagnetic signals.

The activation to acquire T2 relaxation is called the CPMG echo train ("Carr-Purcell-Meiboom-Gill"), as demonstrated in an exemplary manner in FIG. 3. The CPMG echo train in FIG. 3 has an initial waiting time 306 (Tw), which can be long enough for the fluid to reach full polarization, that is, for 100% of the nuclei of the fluid to align with the constant magnetic field of the NMR tool. Then, a series of radio frequency pulses are applied, such as pulse 308 followed by pulses 310 and 312. Between the pulses, echoes 314 are formed and measured through the antenna of the NMR tool. The amplitude of these echoes decays exponentially with time and the T2 distribution is then obtained by fitting a multi-exponential function to the measured decay. The time between 180° pulses is called echo spacing.

The signal amplitude is measured as a function of the echo time, calculated according to the following equation:

$$t_{echo} = nT_E \qquad (3)$$

wherein:
$t_{echo}$ is the time of echoes;
n is the number of echoes; and
$T_E$ is the spacing between echoes.

For a fluid with just a single relaxation time T2, the signal amplitude decays exponentially according to the equation:

$$S(t_{echo}) = S(0)\, \exp\left(-n\frac{T_E}{T_2}\right) \qquad (4)$$

wherein:
S is the amplitude of the signal.

On the other hand, when several T2 are present, the signal will be the sum of all components, according to the following equation:

$$S(t_{echo}) = \int dT_2 f(T_2)\, \exp\left(-n\frac{T_E}{T_2}\right) \qquad (5)$$

wherein:
f(T2) is the distribution function of T2.

The acquisition and subsequent processing of a train of echoes with total polarization makes it possible to acquire only the T2 distribution of the fluids present in a geological formation. For the T1 and T2 distributions, it is necessary to acquire several echo trains with different waiting times, as shown in an exemplary manner in FIG. 4. In this Figure, a scheme 316 of pulse sequences/echo trains can be seen 318, 320, 324 and 326 of simultaneous measurements of T1 and T2. It should be noted that as the waiting time 328 increases, the amplitude of the echoes also increases in accordance with the T1 relaxation time of the fluids.

In an experiment such as the one demonstrated in FIG. 4, signal growth can be represented by the following equation:

$$1 - \exp\left(-\frac{T_W}{T_1}\right) \qquad (6)$$

wherein:
Tw is the waiting time; and
T1 is the relaxation time.

Therefore, the dependence of the signal in an experiment considering the period of polarization and magnetic decay, with both waiting times and echo times, is given by:

$$S(T_W t_{echo}) = \int dT_1 dT_2 f(T_1,\ T_2)\left[1 - \exp\left(-\frac{T_W}{T_1}\right)\right] \exp\left(-n\frac{T_E}{T_2}\right). \qquad (7)$$

The distributions of T1 and T2 are then obtained by fitting a two-dimensional multi-exponential function to the measured polarization and decay. It should be noted that the processing of this data is quite complex.

Furthermore, to adequately obtain a T1-T2 map, a sufficiently large number of combinations of T1 and T2 values are necessary. Therefore, the activation of the NMR tool needs to acquire several trains of echoes with different combinations of waiting times, number of echoes and spacing between echoes that allow adequate mapping of the different magnetic decays after different periods of polarization. An example of activation to obtain the T1-T2 map is presented in Table 1, below:

TABLE 1

| ID | TW (s) | TE (s) | Number of echoes | Number of repetitions | Total time per ID (s) |
|---|---|---|---|---|---|
| 1A | >12 | 0.001 | 500 | 1 | 12.5 |
| 1B | 1 | 0.001 | 500 | 1 | 1.5 |
| 1C | 0.03 | 0.0002 | 50 | 24 | 0.27 |
| 2A | >12 | 0.0002 | 5,000 | 1 | 13 |
| 2B | 1.5 | 0.0002 | 5,000 | 1 | 2.5 |
| 2C | 0.03 | 0.0002 | 50 | 24 | 0.27 |
| 3A | >12 | 0.0002 | 5,000 | 1 | 13 |
| 3B | 2.8 | 0.0002 | 5,000 | 1 | 3.8 |
| 3C | 0.03 | 0.0002 | 50 | 24 | 0.27 |
| 4A | >12 | 0.003 | 200 | 1 | 12.6 |
| 4B | 2.4 | 0.003 | 200 | 1 | 3 |
| 4C | 0.03 | 0.0002 | 50 | 24 | 0.27 |
| 5A | >12 | 0.0002 | 4,000 | 1 | 12.8 |
| 5B | 5.6 | 0.0002 | 4,000 | 1 | 6.4 |
| 6A | >12 | 0.0002 | 3,000 | 1 | 12.6 |
| 6B | 0.5 | 0.0002 | 475 | 1 | 0.595 |
| 6C | 0.5 | 0.0002 | 475 | 1 | 0.595 |
| 6D | 0.1 | 0.0002 | 225 | 1 | 0.145 |
| 6E | 0.1 | 0.0002 | 100 | 1 | 0.12 |
| 6F | 0.05 | 0.0002 | 100 | 1 | 0.07 |
| 7A | >12 | 0.0002 | 2,500 | 1 | 12.5 |
| 7B | 0.5 | 0.0002 | 475 | 1 | 0.595 |
| 7C | 0.15 | 0.0002 | 225 | 1 | 0.195 |
| 7D | 0.075 | 0.0002 | 100 | 1 | 0.095 |
| 7E | 0.05 | 0.0002 | 100 | 1 | 0.07 |
| 8A | >12 | 0.0002 | 2,000 | 1 | 12.4 |
| 8B | 0.2 | 0.0002 | 225 | 1 | 0.245 |
| 8C | 0.1 | 0.0002 | 225 | 1 | 0.145 |
| 8D | 0.05 | 0.0002 | 100 | 1 | 0.07 |
| 8E | 0.05 | 0.0002 | 100 | 1 | 0.07 |
| Total acquisition time | | | | | 122.69 |

The several combinations of waiting times, number of echoes and spacing between echoes of this activation generate a mapping of magnetic decays after different periods of polarization as illustrated by way of example in FIG. 5, providing an amount of data suitable for subsequent processing and acquisition of the T1-T2 map.

However, it is clear that an activation such as the one proposed in Table 1 is extremely time-consuming. Considering the sum of the waiting times and the entire decay time, this acquisition takes around 122.69 seconds to acquire enough data to obtain a T1-T2 map. Considering the acquisition in wells drilled in geological formations, with thicknesses of tens to hundreds of meters and an interval between measurements of 20 cm, an acquisition of T1-T2 maps can take tens of hours, increasing costs.

As an alternative to acquiring T1-T2 maps, other activations allow the acquisition of a reduced number of combinations of waiting times, number of echoes and spacing between echoes, as shown in Table 2, below:

TABLE 2

| ID | TW (s) | TE (s) | Number of echoes | Number of repetitions | Total time per ID (s) |
|---|---|---|---|---|---|
| A | 8.422 | 0.0009 | 500 | 1 | 8.872 |
| B | 2.2 | 0.0009 | 20 | 1 | 2.218 |
| C | 0.01 | 0.0006 | 10 | 24 | 0.154 |
| D | 0.03 | 0.0006 | 10 | 24 | 0.174 |
| E | 0.1 | 0.0006 | 10 | 1 | 0.106 |
| F | 0.3 | 0.0006 | 10 | 1 | 0.306 |
| | Total acquisition time | | | | 11.83 |

In Table 2, it can be seen that the total acquisition time is around 11.83 seconds, ten times shorter than the activation previously shown in Table 1, greatly reducing the costs involved.

However, as shown in an exemplary manner in the 3D graph in FIG. 6, the mapping of magnetic decays after different periods of polarization is also greatly reduced, making processing to obtain a T1-T2 map impossible. With this activation, it is possible to obtain only the marginal distributions of T1 and T2.

Based on the above, therefore, it is clear that relaxation time maps (called T1-T2 maps), acquired in well logging operations, provide extremely valuable information in the evaluation of formations, allowing the identification and quantification of pores and fluids in the rock and improving estimates of porosity, hydrocarbon saturation and permeability of reservoirs, fundamental in the management of oil and gas producing fields.

However, currently, the only way to acquire T1-T2 maps in well logging operations is through specific acquisitions of nuclear magnetic resonance tools. However, in addition to being expensive due to the complexity of the operation, this way of acquiring T1-T2 maps is also quite time-consuming (around 17 hours or more), as it requires specific processing of the devices and logging methods.

A more economical and faster alternative for evaluating formation, as it does not require specific data processing, is to acquire only the marginal distributions of T1 and T2. However, as shown above, this alternative of obtaining only the marginal distributions of T1 and T2 is not capable of generating the T1-T2 maps directly, as even though it provides relevant information, the interpretation of these components is not trivial.

Therefore, in view of the problems highlighted and discussed, there is a need in the current state of the art for the development of a method capable of interpreting and processing the marginal distributions of T1 and T2 for the generation of synthetic T1-T2 maps, facilitating, thus, the use of this information in estimating reservoir properties, such as porosity, hydrocarbon saturation and reservoir permeability, among others.

STATE OF THE ART

The search for the history of the invention in question led to some documents that disclose subject matters within the technological field of the present invention.

The document US 2005/0240349 A1 discloses a method and apparatus for decomposing a complex distribution of data, modeling the complex distribution as a sum of discrete simple distributions, and processing the simple distributions independently. Independent processing allows the complex distribution to be reconstructed without the simple distributions being considered spurious. Simple distributions preferably include one or more statistical distributions that are subject to being characterized by a reduced data set for efficient communication and reconstruction of the complex distribution. The modeling and processing steps preferably employ one or more evolutionary algorithms. However, the aforementioned prior art document does not mention an appropriate processing to be carried out after the decomposition of marginal distributions of T1 and T2, acquired from the NMR tool, which would be capable of obtaining synthetic T1-T2 maps.

Furthermore, the document US 2020/0264331 A1 relates to methods and systems for characterizing fluids in an underground formation traversed by a well, where nuclear magnetic resonance data is measured by a downhole NMR tool that is transported in the well that crosses the formation. The NMR data are processed to derive T1-T2 maps at different depths of the formation. The T1-T2 maps at different depths of the formation can be processed to generate a cluster map of different fluids that are present in the formation, where the cluster map is a two-dimensional array of grid points in the T1-T2 domain with each point grid being assigned or classified to a specific fluid. The cluster map of different fluids that are in the formation can be used to characterize properties of the formation, such as fluid volumes for the different fluids at one or multiple depths. However, the aforementioned document proposes a cluster map being a 2D arrangement of mesh points in the T1-T2 domain, in which each point is associated with a certain fluid. This document does not disclose or suggest suitable ways of processing the decomposition of T1 and T2 marginal distributions and generating synthetic T1-T2 maps.

In its turn, the document US 2017/0123098 A1 discloses methods and systems for characterizing an underground formation using nuclear magnetic resonance measurements. One method includes locating a downhole logging tool in a wellbore that traverses the underground formation and performing NMR measurements to obtain NMR data for a region of the underground formation. NMR data are processed employing sparse Bayesian learning (SBL) to determine a multidimensional property distribution of the NMR data (e.g., T1-T2, D-T2, and D-T1-T2 distributions). Sparse Bayesian learning can utilize Bayesian inference that involves a prioritization over a vector of basis coefficients governed by a set of hyperparameters, one associated with each basis coefficient, likely values are estimated iteratively from the NMR data. Sparse Bayesian learning can achieve sparsity because the posterior distributions of many of these basis coefficients have a sharp peak around zero. In other words, the aforementioned document proposes a method for characterizing underground formations that processes NMR data by applying an SBL ("Sparse Bayesian learning") approach to determine a distribution of multidimensional properties.

Finally, the document US 2017/0343497 A1 discloses that the downhole fluid volumes of a geological formation can be estimated using nuclear magnetic resonance measurements, even in organic shale reservoirs. Multidimensional NMR measurements, such as two-dimensional NMR measurements and/or, in some cases, one or more well logging measurements related to total organic carbon can be used to estimate downhole fluid volumes of hydrocarbons such as bitumen, hydrocarbon light, kerogen and/or water. Having identified the fluid volumes in this way or any other suitable way from the NMR measurements, a reservoir producibility index (RPI) can be generated. Downhole fluid volumes and/or RPI can be produced in a well log to allow an operator to make operational and strategic decisions for well production. However, the aforementioned document does not address issues related to the acquisition and processing of NMR data and, more specifically, the processing of T1 and T2 marginal distributions, for the generation of synthetic T1-T2 maps and typification and quantification of different fluids present in geological formation.

BRIEF DESCRIPTION

The present invention is applied in the area of well logging to evaluate geological formations in oil and gas producing fields.

Specifically, with the aim of solving the problems encountered in the prior art, the present invention aims to develop a fast, effective and accurate solution for evaluating geological formations, by providing a method for generating a synthetic T1-T2 map, based on marginal distributions of T1 and T2 relaxation times measured using an NMR tool, allowing the typification and quantification of different fluids present in the geological formation in low-cost information acquisition scenarios.

Furthermore, the present invention defines a method capable of interpreting the marginal distributions of T1 and T2 and generating synthetic maps of T1-T2 from the decomposition of these distributions into two-dimensional functions of log-normal distributions (or simply, log-normal functions). In this way, by generating synthetic T1-T2 maps from the marginal distributions of T1 and T2, extremely relevant information is produced for the evaluation of formations, without increasing the costs involved in logging operations and drastically reducing the information acquisition time.

Thus, according to an embodiment of the present invention, a method is provided for generating synthetic T1-T2 maps from marginal distributions of nuclear magnetic resonance logging tools, wherein the method comprises: decomposing marginal distributions T1 and T2 relaxation time in an initial sum of log-normal functions with the same amplitudes and different means and standard deviations; setting the initial amplitudes, means and standard deviations so that the sum of log-normal functions corresponds to the marginal distributions of T1 and T2; and using the amplitudes, means and standard deviations set in a sum two-dimensional log-normal functions to generate a synthetic T1-T2 map.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The brief description above and the detailed description below will be better understood when read in conjunction with the attached drawings. For the purpose of illustrating the present invention, embodiments thereof are shown in the drawings. It must be understood, however, that the invention in question is not limited only to the precise arrangements and instruments shown.

DETAILED DESCRIPTION

In the following, reference is made in detail to the preferred embodiments of the present invention illustrated in the attached drawings. Whenever possible, the same or similar reference numbers will be used throughout the drawings to refer to the same or similar features. It should be noted that the drawings are in simplified form and are not drawn to precise scale, so slight variations are anticipated.

The present invention provides a method applicable to marginal distributions of T1 and T2 acquired in logging operations with nuclear magnetic resonance (NMR) tools. The generated synthetic T1-T2 maps can be used in the evaluation of geological formations to estimate the porosity, hydrocarbon saturation and permeability of reservoirs, for example. These estimates are capable of supporting geological models and reservoir flow simulation, impacting projections of production curves, which are essential for the proper management of oil and gas fields.

In particular, the present invention relates to a method for generating synthetic T1-T2 maps from marginal T1 and T2 distributions measured by nuclear magnetic resonance (NMR) logging tools in uncased drilling wells drilled in geological formations, preferably in oil wells.

The generation of synthetic T1-T2 maps, according to the methodology provided by the present invention, allows the typification and quantification of different fluids present in the geological formation of interest, in low-cost information acquisition scenarios.

Initially, the marginal distributions of T1 and T2 are acquired by the NMR tool by measuring and processing a series of magnetic decays after different polarization periods, according to a combination of different waiting times, number of echoes and spacing between echoes, known as tool activation.

As already mentioned, although it is faster and less expensive, the reduced number of activation parameters for acquiring the marginal distributions of T1 and T2 does not allow processing to obtain T1-T2 maps, so that the absence of this information impacts the typification and quantification of fluids present in the formation.

The marginal distributions of T1 and T2 represent the projections of the T1-T2 maps onto the T1 domain and the T2 domain. Therefore, the marginal distributions are a sum of the map in the direction of one of its axes, as shown in FIG. 7, where T1 is represented along the vertical axis (ordinate) of the map and T2 is represented along the horizontal axis (abscissa) of the map.

Figure 1:
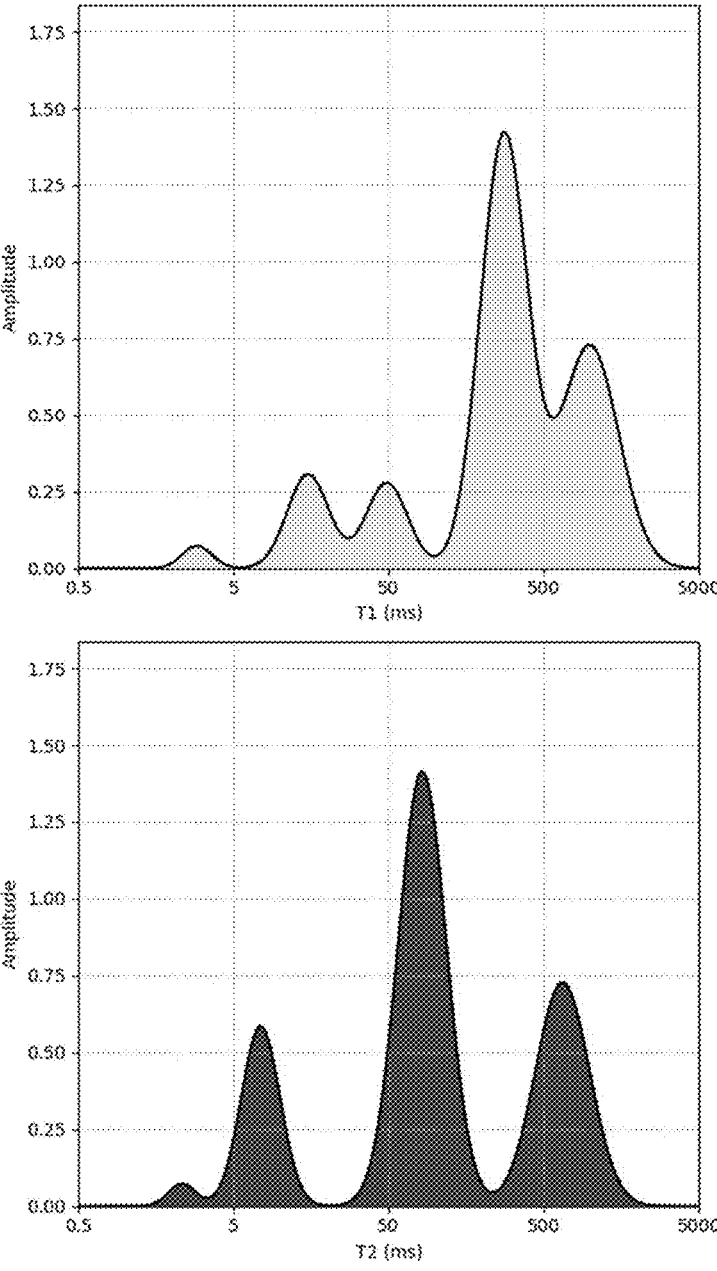
FIG. 1 shows examples of T1 (top graph) and T2 (bottom graph) distributions acquired by NMR tools in uncased drilling wells drilled in geological formations.
Figure 2:
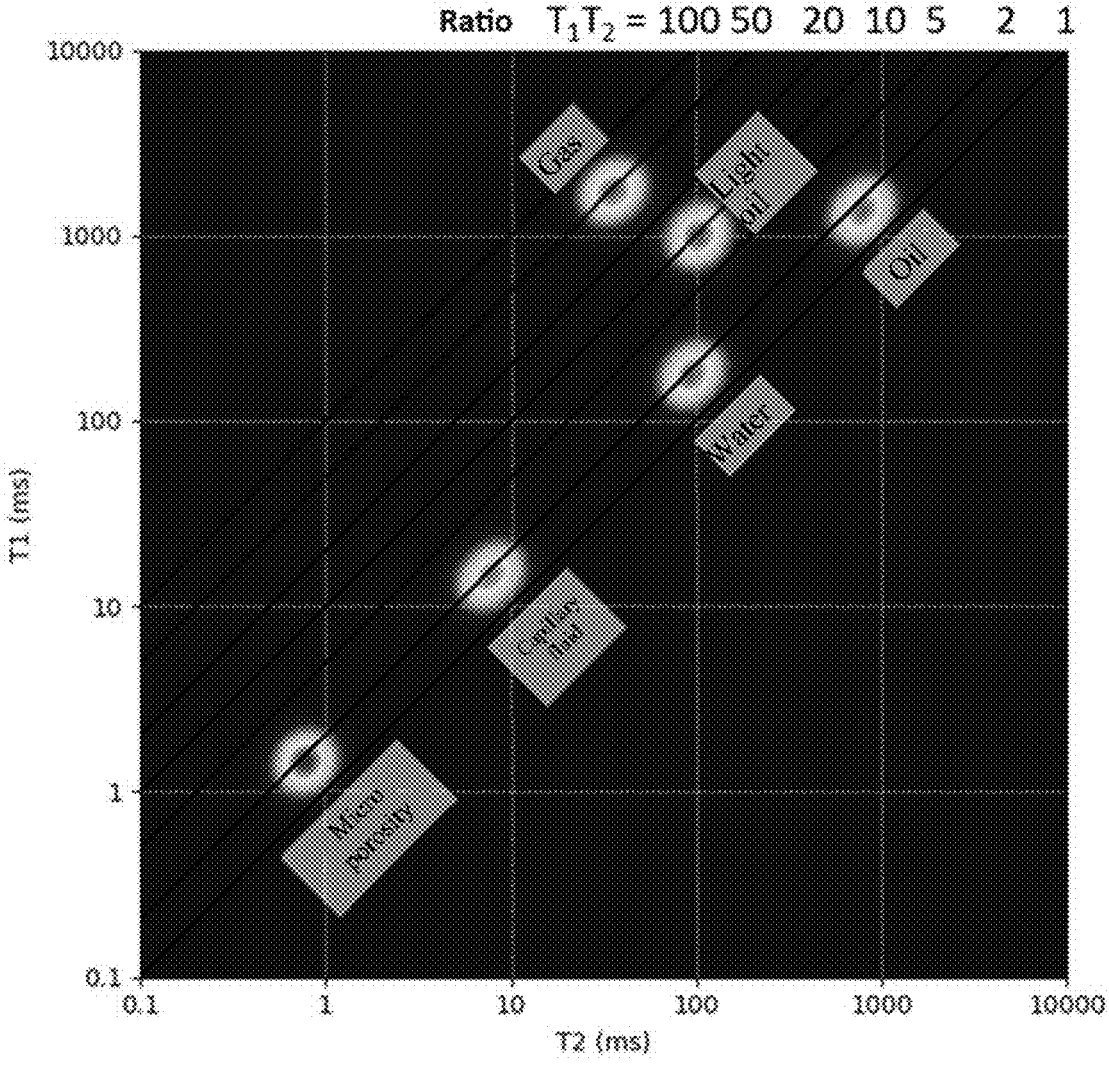
FIG. 2 shows an example of a schematic T1-T2 map, showing the location of the main signs of fluids present in geological formations saturated by water and hydrocarbons.
Figure 3:
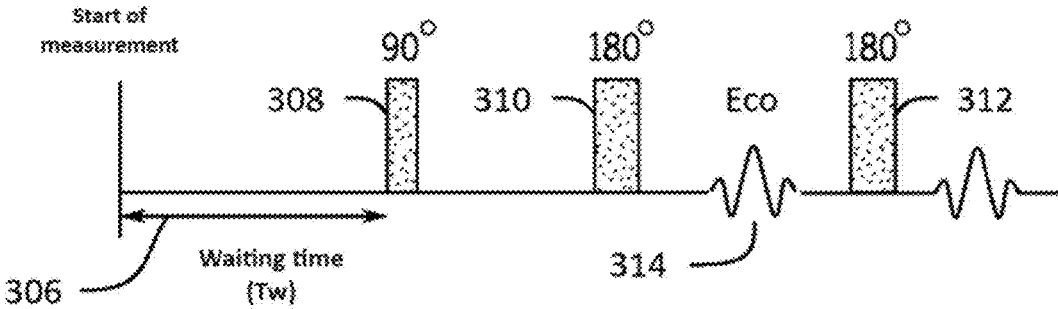
FIG. 3 shows an example of a CPMG echo train containing its main components.
Figure 4:
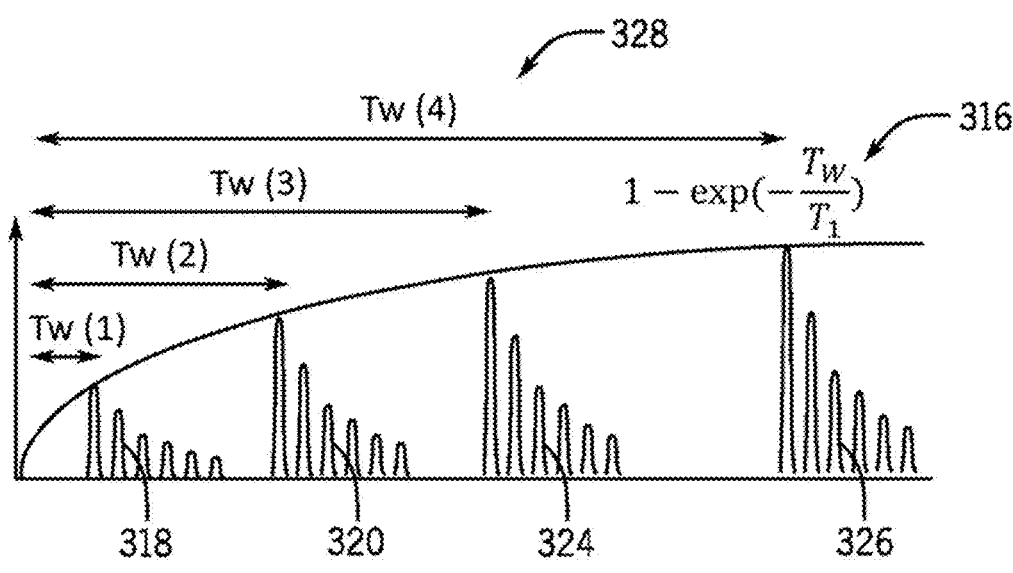
FIG. 4 shows an example of an acquisition of four trains of echoes at different waiting times, and the evolution curve representing their signal over time, necessary for acquiring the T1 distribution.
Figure 5:
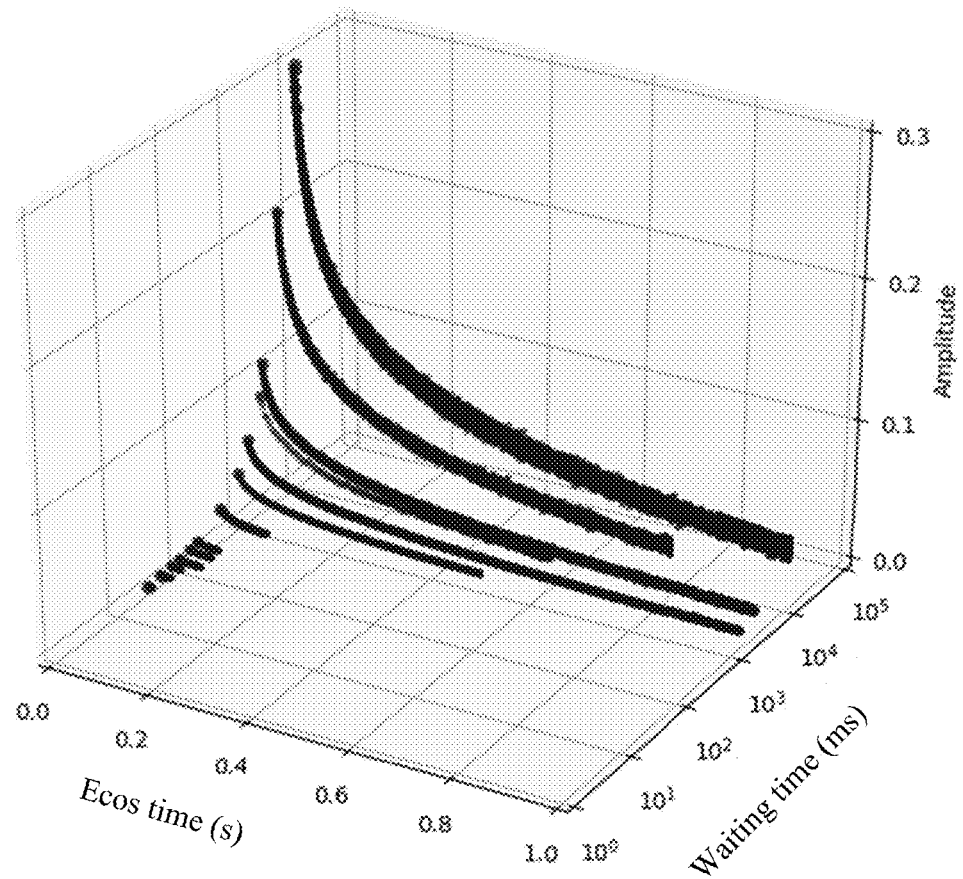
FIG. 5 shows an example of several magnetic decays after different polarization periods obtained through the combination of different waiting times, number of echoes and spacing between echoes of an activation of the NMR tool to generate the T1-T2 map.
Figure 6:
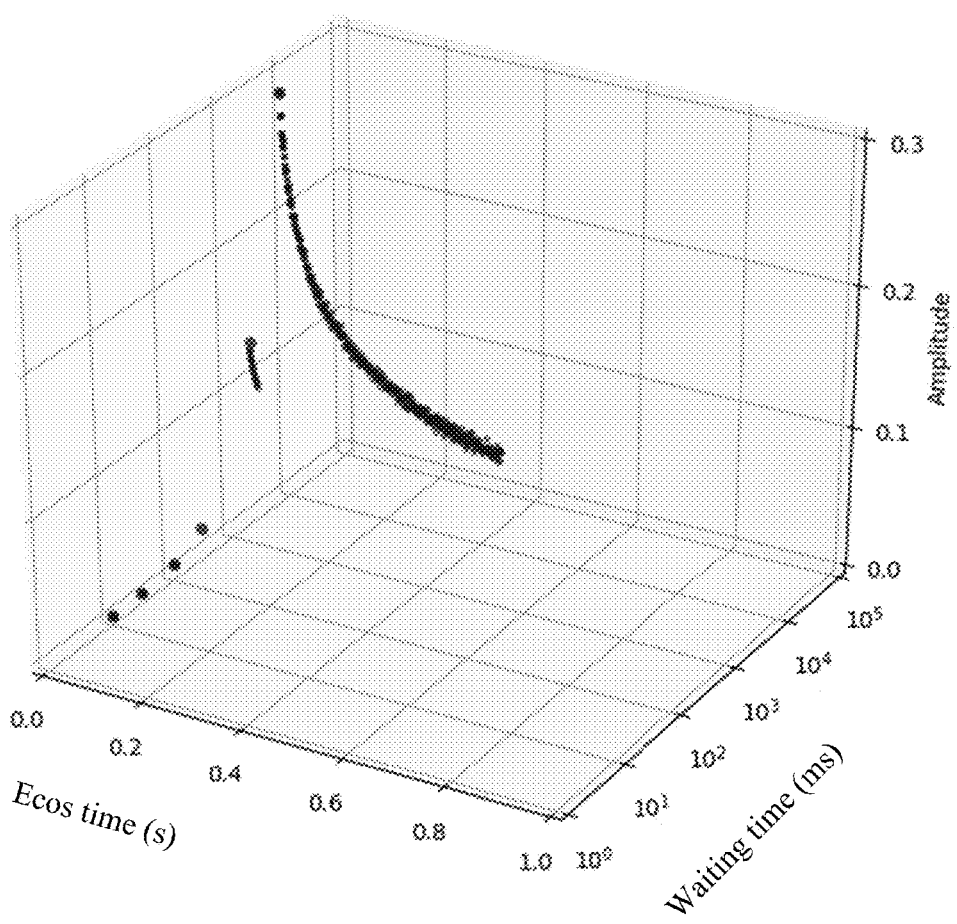
FIG. 6 shows an example of several magnetic decays after different polarization periods obtained through the combination of different waiting times, number of echoes and spacing between echoes of an activation of the NMR tool to generate marginal distributions of T1 and T2.
Figure 7:
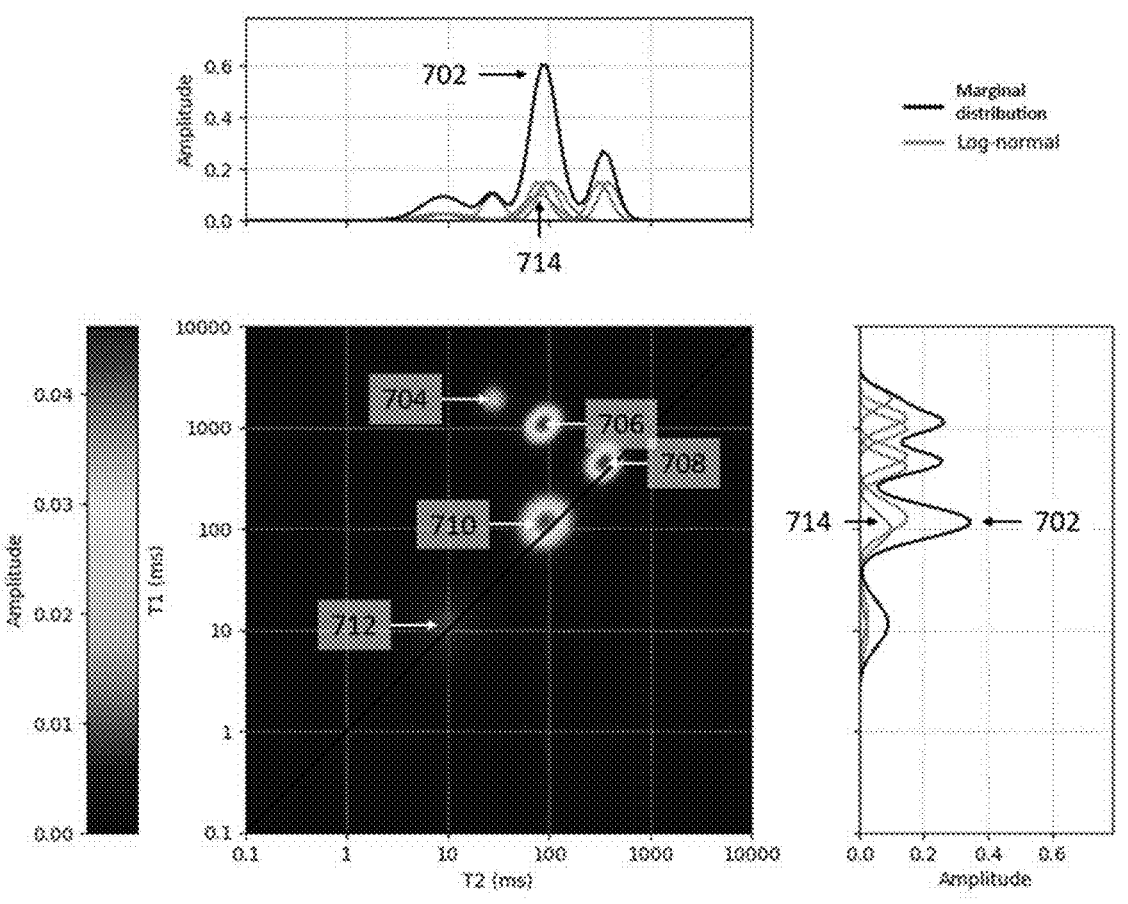
FIG. 7 shows a T1-T2 map and their respective marginal distributions projected onto the T1 and T2 domains, decomposed into log-normal functions, according to an embodiment of the present invention.

Referring to FIG. 7, the complex shapes of the marginal distributions of T1 and T2 relaxation times, projected in the graphs above and to the right of the map, represent the sum of a plurality of fluid signals 704, 706, 708, 710, 712, even taking into account the overlap of signals, as is the case of fluid signals 706 and 710 in T2, and 704 and 706 in T1.

In general, fluid signals can have a more simplified format, being approximated by a sum of 2D log-normal functions, according to the following equation:

$$F(T_1, T_2) = \sum_{i=1}^{N} A_i \exp\left[-\left(\frac{(T_1 - \overline{T_{1i}})^2}{2\sigma_{1i}^2} + \frac{(T_2 - \overline{T_{2i}})^2}{2\sigma_{2i}^2}\right)\right] \quad (8)$$

wherein:

N is the number of log-normal functions;

A is the amplitude of the log-normal function;

$T_1$ and $\sigma_1$ are the mean and standard deviation values of the log-normal function in the T1 domain, respectively; and $T_2$ and $\sigma_2$ are the mean and standard deviation values of the log-normal function in the T2 domain, respectively.

Thus, the log-normal functions 714 are projected onto their respective domains, as evidenced in FIG. 7.

In this way, it is noted that the inverse process can be carried out, that is, the marginal distributions of T1 and T2, obtained from measurements made by an NMR tool, are decomposed into a sum of 1D log-normal functions (one-dimensional) in their respective domains T1 and T2 with amplitude link, according to the following equations:

$$F(T_1) = \sum_{i=1}^{N} A_i \exp\left[-\left(\frac{(T_1 - \overline{T_{1i}})^2}{2\sigma_{1i}^2}\right)\right] \quad (9)$$

$$F(T_2) = \sum_{i=1}^{N} A_i \exp\left[-\left(\frac{(T_2 - \overline{T_{2i}})^2}{2\sigma_{2i}^2}\right)\right]. \quad (10)$$

The obtained amplitude, mean and standard deviation values can then be used in Equation 8 to reconstruct the T1-T2 map, thus giving rise to the synthetic T1-T2 map.

To determine the parameters related to the amplitudes, mean and standard deviations of the log-normal functions that will decompose the marginal distributions of T1 and T2, a non-linear optimization process can be used, applying or not non-negativity restrictions.

However, preferably, an initial manual estimate of these parameters (amplitudes, means and/or standard deviations) can be selected and seted N times the number of parameters (e.g., A, $T_1$, $\sigma_1$, $T_2$ and $\sigma_2$) so that the optimization process converges to an adequate solution. Thus, through a computing or processing device, the initial T1 and T2 amplitudes and averages are selected and a non-linear optimization process, such as a non-linear least squares optimizer, refines or sets these values, further setting the standard deviation values. Then, the seted parameters are used in the sum of two-dimensional log-normal functions to generate the synthetic T1-T2 map.

It is noteworthy that the synthetic T1-T2 map generation method of the present invention applies to marginal T1 and T2 distributions of any type and tool, including, but not limited to, NMR logging tools.

Furthermore, the method of generating synthetic T1-T2 maps of the present invention can be applied to a wide variety of geological formations, such as, for example, oil wells or uncased drilling wells, drilled in geological formations of any type, including, but not limited to oil wells.

Figure 8:
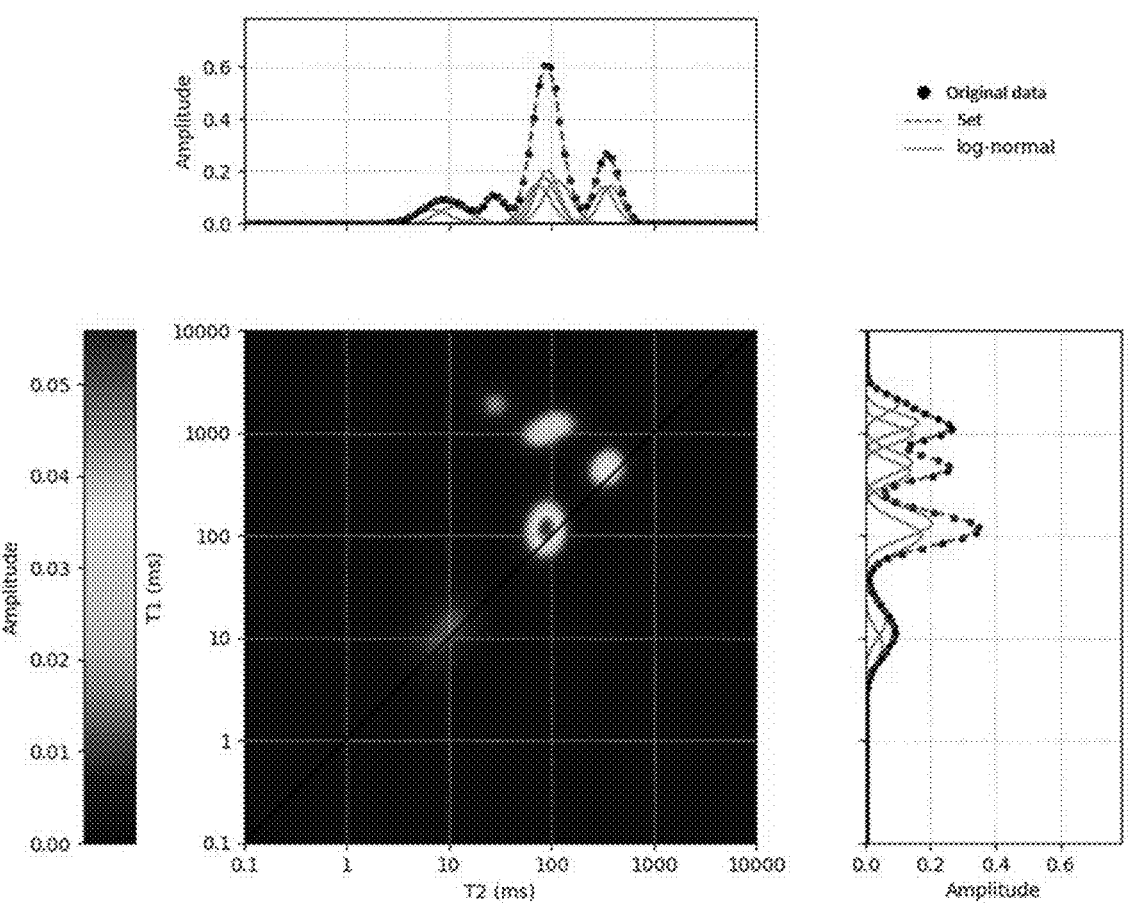
FIG. 8 shows a synthetic T1-T2 map generated from applying the method of the present invention to the marginal distributions of T1 and T2 of FIG. 7, according to an embodiment of the present invention.

FIG. 8 shows a synthetic T1-T2 map generated from the method of the present invention using the marginal T1 and T2 distributions shown in FIG. 7.

In FIG. 8, it is observed that the sum of the log-normal functions obtained from the decomposition of the marginal distributions of T1 and T2 corresponds to the original data, just as the synthetic T1-T2 map corresponds to the original map of FIG. 7, given the adequacy of the signals represented with the fluid signals 704, 706, 708, 710, 712.

Additionally, experimental tests were conducted, in which the method of the present invention was applied to marginal distributions of T1 and T2 obtained in real rock samples. The generated synthetic T1-T2 maps, shown in FIGS. 10 and 12, were compared, respectively, with the real T1-T2 maps in FIGS. 9 and 11.

Figure 9:
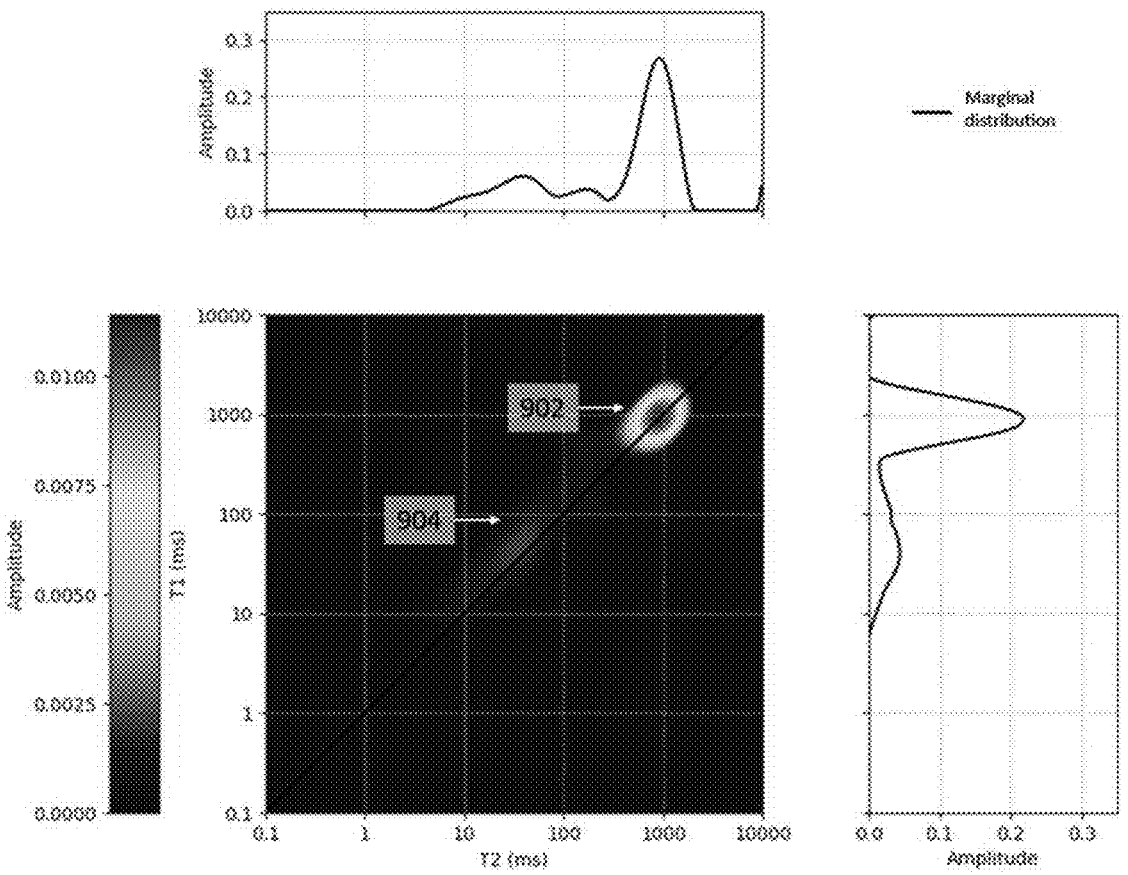
FIG. 9 shows a T1-T2 map of a sandstone sample saturated with oil and water and their respective marginal distributions projected in the T1 and T2 domains, according to an embodiment of the present invention.

FIG. 9 shows a real T1-T2 map of a sandstone sample saturated with oil and water and their respective projected marginal distributions in the T1 and T2 domains. In said FIG. 9, two main fluid signals 902, 904 are present, which proportionally represent 52% and 48% of the signal amplitude, respectively.

Figure 10:
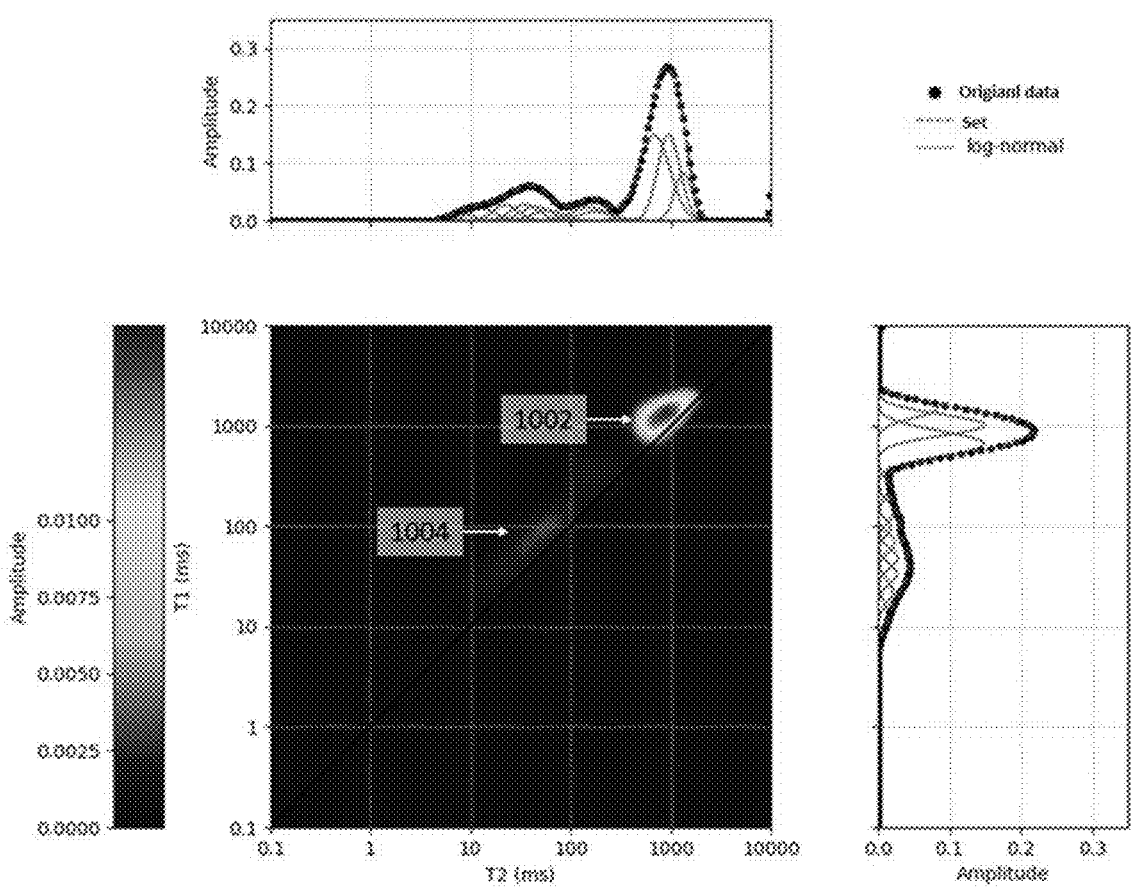
FIG. 10 shows a synthetic T1-T2 map generated from applying the method of the present invention to the marginal distributions of T1 and T2 of FIG. 9, according to an embodiment of the present invention.

FIG. 10 represents the synthetic T1-T2 map generated from an embodiment of the method of the present invention applied to the marginal distributions of T1 and T2 of the sandstone sample saturated with oil and water obtained from an NMR tool. In FIG. 10, two signals 1002 and 1004 are observed, equivalent to signals 902 and 904 in FIG. 9, representing 58% and 42% of the amplitude of the synthetic map signal, respectively. Therefore, it is noteworthy that the synthetic T1-T2 map shows high correspondence with the real map.

Figure 11:
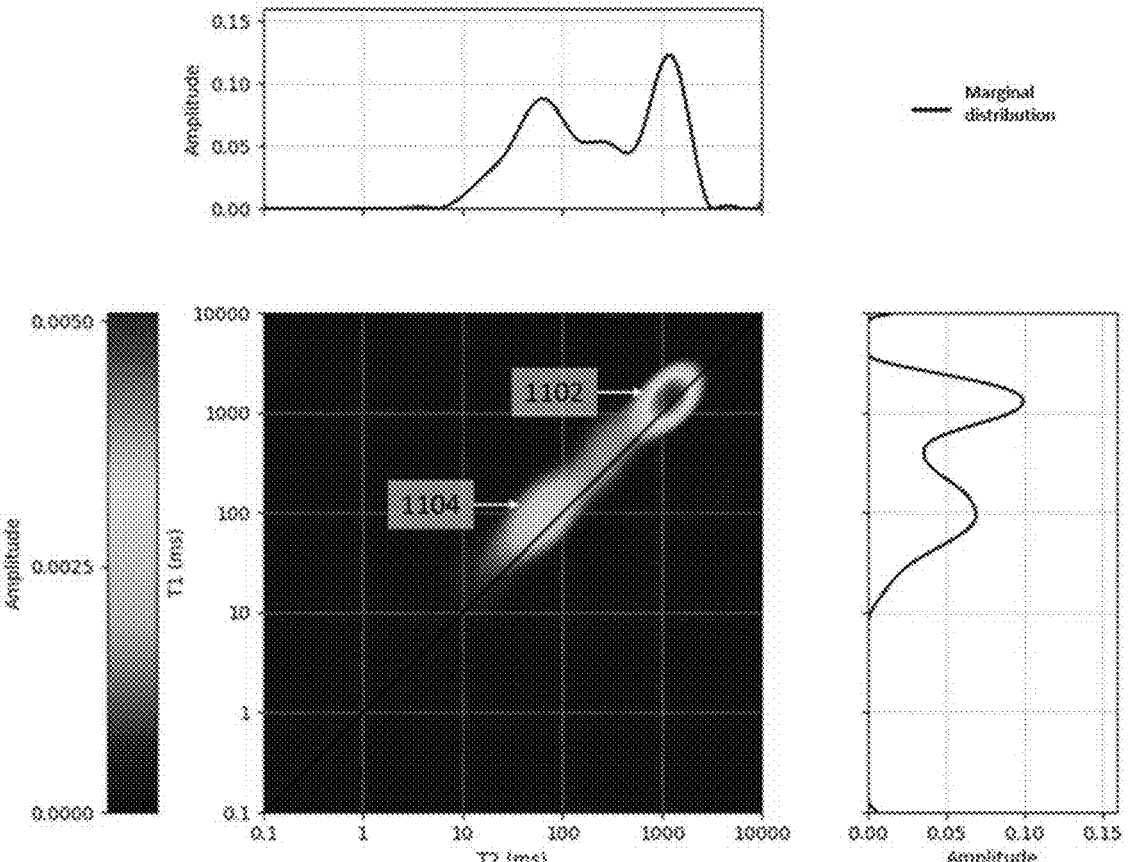
FIG. 11 shows a T1-T2 map of a sandstone sample saturated with water and their respective marginal distributions projected into the T1 and T2 domains, according to an embodiment of the present invention.

Furthermore, FIG. 11 shows a real T1-T2 map obtained from a water-saturated sandstone sample and their respective projected marginal distributions in the T1 and T2 domains. In FIG. 11, two main fluid signals 1102 and 1104 can be observed, which proportionally represent 40% and 60% of the signal amplitude, respectively.

Figure 12:
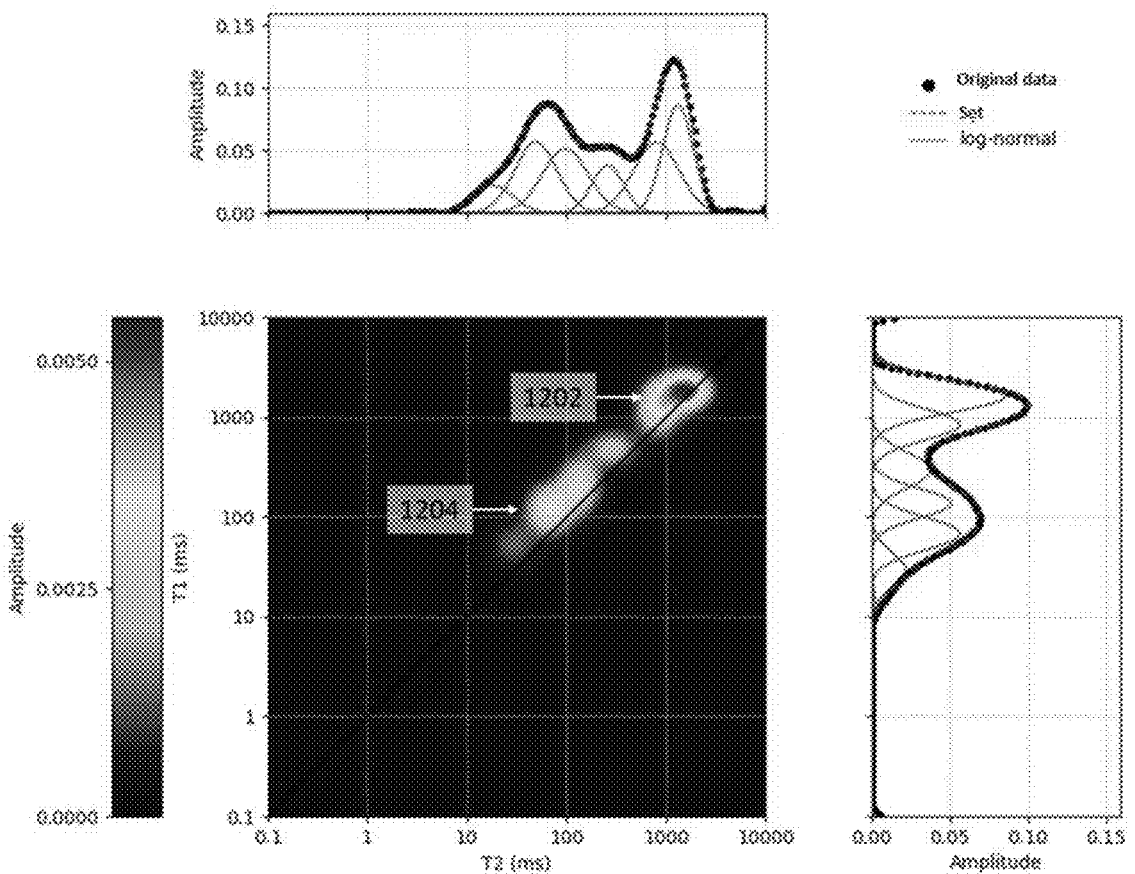
FIG. 12 shows a synthetic T1-T2 map generated from applying the method of the present invention to the marginal distributions of T1 and T2 of FIG. 11, according to an embodiment of the present invention.

In its turn, FIG. 12 shows the synthetic T1-T2 map generated from an embodiment of the method of the present invention applied to the marginal distributions of T1 and T2 of the sandstone sample saturated with oil and water. In FIG. 12, two signals 1202 and 1204 are observed, equivalent to signals and 1102 and 1104 in FIG. 11, representing 41% and 59% of the amplitude of the synthetic map signal, respectively. Therefore, it is noted that the generated synthetic T1-T2 map also presents a relevant correspondence with its real T1-T2 map.

Therefore, based on the results presented, it is noted that the synthetic T1-T2 maps obtained are quite satisfactory, allowing the detection and quantification of the same original fluid signals as the rock samples.

Thus, as described in detail above, the present invention offers a solution to the prior art problems related to the lack of effective methodologies for generating synthetic T1-T2 maps from only the marginal distributions of T1 and T2. Thus, the present invention provides a method for generating synthetic T1-T2 maps from marginal distributions of nuclear magnetic resonance logging tools, wherein the method comprises: decomposing marginal distributions of T1 and T2 relaxation times into a sum of initial log-normal functions with the same amplitudes and different means and standard deviations; setting the initial amplitudes, means and standard deviations so that the sum of log-normal functions corresponds to the marginal distributions of T1 and T2; and using the amplitudes, means and standard deviations set in a sum of two-dimensional log-normal functions to generate a synthetic T1-T2 map.

Therefore, it is evident that the synthetic T1-T2 map generation method of the present invention provides the obtaining of 2 maps in low-cost information acquisition scenarios, allowing the typification and quantification of different fluids present in the formation geological analysis in a faster and more effective way than T1-T2 maps obtained by traditional means.

Thus, for the oil and gas industry, the synthetic T1-T2 map generation correction method of the present invention represents a huge advance for the study and characterization of oil reservoirs, in which T1-T2 maps are analyzed quantitatively to infer properties and characteristics of the geological formation, such as porosity, hydrocarbon saturation and permeability.

It will be apparent to one skilled in the art that this invention can be implemented using one or more general purpose computers, computing or processing devices suitable with appropriate hardware and instructed to execute the processes of the present invention. Instructions may be carried out through the use of one or more storage devices readable by the computer's processor and containing one or more instructions executable by the computer to perform the operations described above. The computer-readable instruction storage device may take the form of, for example, a CD-ROM or other optical disc; a magnetic tape; a read-only memory (ROM) chip; and other forms well known in the art or subsequently developed for data storage. The processing means may be implemented in the computer on the surface, in the logging tool, or shared by the two, as is known in the art. It will also be appreciated by a person skilled in the art that the techniques of the invention can be used with any type of well logging system, e.g., fixed tools, LWD/MWD ("Logging While Drilling"/"Measurement While Drilling") tools, or others.

Those skilled in the art will value the knowledge presented here and will be able to reproduce the invention in the presented embodiments and in other variants, covered within the scope of the attached claims.

The invention claimed is:

1. A method, comprising:
acquiring marginal distributions of $T_1$ and $T_2$ relaxation times in a geological formation;

decomposing the marginal distributions of $T_1$ and $T_2$ relaxation times into a sum of log-normal functions with same amplitudes and different means and standard deviations;

setting the amplitudes, means and standard deviations so that the sum of log-normal functions corresponds to the marginal distributions of $T_1$ and $T_2$;

using the set amplitudes, means and standard deviations to generate a synthetic $T_1$-$T_2$ map; and estimating properties and characteristics of the geological formation using the generated synthetic $T_1$-$T_2$ map.

2. The method, according to claim 1, wherein the setting step further comprises selecting and setting, through non-linear optimization, N initial estimates of amplitudes, means and standard deviations of log-normal functions in the marginal distribution of $T_1$.

3. The method, according to claim 1, wherein the setting step further comprises selecting and setting, through non-linear optimization, N initial estimates of amplitudes, means and standard deviations of log-normal functions in the marginal distribution of $T_2$.

4. The method, according to claim 1, wherein setting the amplitudes (A), means ($\overline{T_1}$) and standard deviations ($\sigma_1$) of $T_1$, and means ($\overline{T_2}$) and standard deviations ($\sigma_2$) of $T_2$, in a sum of N one-dimensional log-normal functions in their respective domains with amplitude link is carried out through the following relations:

$$F(T_1) = \sum_{i=1}^{N} A_i \exp\left[-\left(\frac{(T_1 - \overline{T_{1i}})^2}{2\sigma_{1i}^2}\right)\right]$$

$$F(T_2) = \sum_{i=1}^{N} A_i \exp\left[-\left(\frac{(T_2 - \overline{T_{2i}})^2}{2\sigma_{2i}^2}\right)\right].$$

wherein the sum of one-dimensional log-normal functions corresponds to the respective marginal distributions of $T_1$ and $T_2$.

5. The method, according to claim 1, wherein using the set amplitudes (A), means ($\overline{T_1}$) and standard deviations ($\sigma_1$) of $T_1$, and means ($\overline{T_2}$) and standard deviations ($\sigma_2$) of $T_2$ is performed on a sum of N two-dimensional log-normal functions to generate the synthetic $T_1$-$T_2$ map through the following relationship:

$$F(T_1, T_2) = \sum_{i=1}^{N} A_i \exp\left[-\left(\frac{(T_1 - \overline{T_{1i}})^2}{2\sigma_{1i}^2} + \frac{(T_2 - \overline{T_{2i}})^2}{2\sigma_{2i}^2}\right)\right].$$

6. The method, according to claim 1, wherein the estimated properties and characteristics of the geological formation comprise porosity, hydrocarbon saturation and permeability.

7. The method, according to claim 1, wherein the estimated properties and characteristics of the geological formation comprise typification and quantification of different fluids present in the geological formation.

8. The method, according to claim 1, wherein the geological formation is a reservoir.

9. The method, according to claim 1, wherein the marginal distributions of $T_1$ and $T_2$ relaxation times are acquired in an uncased drilling well in the geological formation.

10. The method, according to claim 9, wherein the marginal distributions of $T_1$ and $T_2$ relaxation times are acquired using a nuclear magnetic resonance logging tool.

11. The method, according to claim 1, wherein the marginal distributions of $T_1$ and $T_2$ relaxation times are acquired in an oil well in the geological formation.

12. The method, according to claim 11, wherein the marginal distributions of $T_1$ and $T_2$ relaxation times are acquired using a nuclear magnetic resonance logging tool.

13. The method, according to claim 1, wherein the marginal distributions of $T_1$ and $T_2$ relaxation times are acquired using a well logging tool.

14. The method, according to claim 13, wherein the well logging tool is a nuclear magnetic resonance logging tool.

15. The method, according to claim 14, wherein the marginal distributions of $T_1$ and $T_2$ relaxation times are acquired by measuring and processing a series of magnetic decays after different polarization periods, according to a combination of different waiting times, number of echoes and spacing between echoes.

16. The method, according to claim 1, wherein the marginal distributions of $T_1$ and $T_2$ relaxation times are acquired by measuring and processing a series of magnetic decays after different polarization periods, according to a combination of different waiting times, number of echoes and spacing between echoes.

17. A non-transitory computer program readable medium comprising instructions which, when executed by an apparatus, cause the apparatus to perform the method according to claim 1.

18. An apparatus, comprising:
a processor; and
a memory including instructions, which when executed using the processor, are configured to cause the apparatus to perform the method according to claim 1.

19. The apparatus, according to claim 18, wherein a well logging system comprises the apparatus.

* * * * *